(12) United States Patent
Hayashi et al.

(10) Patent No.: US 6,331,474 B1
(45) Date of Patent: Dec. 18, 2001

(54) DEFECT COMPENSATION METHOD FOR SEMICONDUCTOR ELEMENT

(75) Inventors: Ryo Hayashi; Keishi Saito, both of Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/630,525

(22) Filed: Aug. 1, 2000

(30) Foreign Application Priority Data

Aug. 3, 1999 (JP) .................................................. 11-220547

(51) Int. Cl.[7] .................................................. H01L 21/322
(52) U.S. Cl. .................................................. 438/476
(58) Field of Search .................................. 438/57, 61, 62, 438/149, 162, 408, 471, 476, 477, 765, 906, 910, 972

(56) References Cited

FOREIGN PATENT DOCUMENTS 8-55858  *  2/1996  (JP) .

* cited by examiner

*Primary Examiner*—Keith Christianson
(74) *Attorney, Agent, or Firm*—Fitzpatrick, Cella, Harper & Scinto

(57) ABSTRACT

A defect compensation method for a semiconductor element to compensate for defects of the semiconductor element, in which hot water is conducted with the semiconductor element to accomplish defect compensation. On the basis of this treatment, excessive progress of oxidation of the crystal grain boundary and retention of water and OH⁻ groups in the film are provented.

22 Claims, 2 Drawing Sheets

DEFECT COMPENSATION METHOD FOR SEMICONDUCTOR ELEMENT

BACKGROUND OF THE INVENTION

1. Field of the Invention

The present invention relates to a defect compensation method for a semiconductor element to compensate for defects of the semiconductor element in the production of the semiconductor element, and particularly relates to the defect compensation method for the semiconductor element to compensate for defects of the semiconductor element in the production of a functional semiconductor element having a semiconductor junction, such as photovoltaic element and a thin film transistor.

2. Related Background Art

Conventionally, when the semiconductor element such as the thin film transistor (TFT) is produced, in the deposition of a semiconductor film, an insulating film, and a metal film, according to a difference in conditions (temperature of substrate, pressure, discharge power, or the like) of deposition of respective films, there are occasions in which many defects caused by strain occur inside respective films and at interfaces between respective films. Besides, there are occasions in which many defects, which are caused by the difference in thermal expansion coefficients and lattice constants of respective films, occur in respective films. Such defects of the thin film transistor function as an electric charge trap and form a space charge in the thin film transistor to thereby lower electric characteristics of the transistor and lower the reproducibility of electric characteristics.

In the case of a silicon-based, thin film, photovoltaic element, a reflecting film and reflection enhancing film, n-type semiconductor film, substantially i-type semiconductor film, p-type semiconductor film (nip structure comprising these films may be stacked a plurality of times as the occasion demands), transparent conductive film (or metal film), and current collecting electrode are configured on a support made of a metal and glass. Particularly, in the case where a microcrystalline semiconductor film and polycrystalline semiconductor film are used as i-type semiconductor film, the crystal grain diameter increases as a semiconductor crystal grows from the support side in the formation of the semiconductor film. As a result, in addition to the above-described defects occurring in the formation of the thin film transistor, a problem in which defects increase in crystal grain boundaries occurs.

In the case where the microcrystalline semiconductor film and polycrystalline semiconductor film are deposited by a plasma CVD method, hydrogen content in the film is decreased by an increase in the crystal grain diameter according to the growth of such films. As the result, defects in the crystal grain boundaries increase.

As the method for the defect compensation to reduce the above-described defects, conventionally proposed methods are atmospheric annealing in an oxygen atmosphere, reducing annealing in a hydrogen atmosphere, and hydrogen plasma annealing. However, these methods for defect compensation are low in the reactivities of oxygen molecules and hydrogen molecules. Therefore, even with a long period of atmospheric annealing, reduction of defects has been achieved insufficiently. In the case of using hydrogen plasma, hydrogen radicals become active and thus, hydrogen radicals etch an impurity in and around a chamber, in which hydrogen plasma is generated, to pose another problem to cause attaching of the impurity to the inside and surface of the semiconductor film.

As the method for solving these problems, the method using water vapor was proposed as described in Japanese Patent Application Laid-Open No. 8-55858. According to this method, in an atmosphere containing water gas of 20 to 400° C. and a partial pressure of 1 Torr or higher and lower than the saturated vapor pressure, a heating step is effected for 15 seconds or longer and shorter than 20 hours. After passing through this heating step, quality of at least one of the semiconductor or the insulating film is changed.

However, the conventional method using water vapor as described in the above described Laid-Open gazette, easily causes a problem in the formation of an insulating film made of SiO, causing degradation of a hot carrier and causing water and $OH^-$ groups to remain in the film. When transistor characteristics superior to the present ones are required, water and $OH^-$ groups retained in the film should be further reduced.

By the method for using water vapor in microcrystalline silicon-based and polycrystalline silicon-based solar cells, oxidation of the crystal grain boundaries may excessively proceed to inhibit electric charge transfer. In the case of a microcrystalline silicon semiconductor deposited by the plasma CVD method, the microcrystalline silicon grows in a sector form from the substrate side toward the growing surface to cause strain inside the microcrystalline silicon semiconductor.

According to the conventional method using water vapor, the compensation is attempted for such defects of the crystal grain boundaries of the microcrystalline silicon semiconductor, and oxidation by water vapor may excessively proceed to expand the crystal grain boundary, increase the internal strain of the microcrystalline silicon semiconductor, and lower the conductivity of the microcrystalline silicon semiconductor.

SUMMARY OF THE INVENTION

The present invention aims to solve the above-described issues. Specifically, the present invention aims to provide a defect compensation method for a semiconductor element, which prevents the formation of the insulating film made of $SiO_2$ causing degradation of the hot carrier and the retention of water and $OH^-$ groups in the film. Furthermore, the present invention aims to provide a defect compensation method for a semiconductor element, which prevents excessive oxidation of the crystal grain boundaries.

The present invention is characterized in that in order to solve the above-described problems, according to the defect compensation method for the semiconductor element to compensate for defects of the semiconductor element, hot water is brought into contact with the above-described semiconductor element to effect the defect compensation of the above-described semiconductor element. Here, hot water means liquid water with a temperature of 30° C. or higher and below the boiling point.

A preferred embodiment of the present invention is characterized in that a defect is compensated for by contacting hot water with the semiconductor element while controlling the temperature of the above-described semiconductor element.

Another preferred embodiment of the present invention is characterized in that a defect is compensated by contacting hot water with the semiconductor element while effecting bubbling with at least one species of He, Ne, Ar, Kr, and Xe as an inert gas, one species of oxygen-containing gas, nitrogen-containing gas, and carbon-containing gas in the above-described hot water.

Still another preferred embodiment of the present invention is characterized in that the atmospheric pressure when the above-described defect compensation is carried out by contacting the above-described hot water with the above-described semiconductor element ranges from 1 atm to 100 atm.

Yet another preferred embodiment of the present invention is characterized in that the temperature of the above-described hot water ranges from 30 to 300° C.

Again, another preferred embodiment of the present invention is characterized in that oxygen-containing gas is contained in the above-described hot water.

Yet still another preferred embodiment of the present invention is characterized in that the above-described oxygen-containing gas is $O_2$.

Again another preferred embodiment of the present invention is characterized in that the above-described hot water is acidic.

Yet still another preferred embodiment of the present invention is characterized in that the above-described semiconductor element comprises silicon atoms.

Again another preferred embodiment of the present invention is characterized in that the above-described semiconductor element comprises germanium atoms.

Yet still another preferred embodiment of the present invention is characterized in that the above-described semiconductor element is the transistor.

DETAILED DESCRIPTION OF THE PREFERRED EMBODIMENTS

Figure 1:
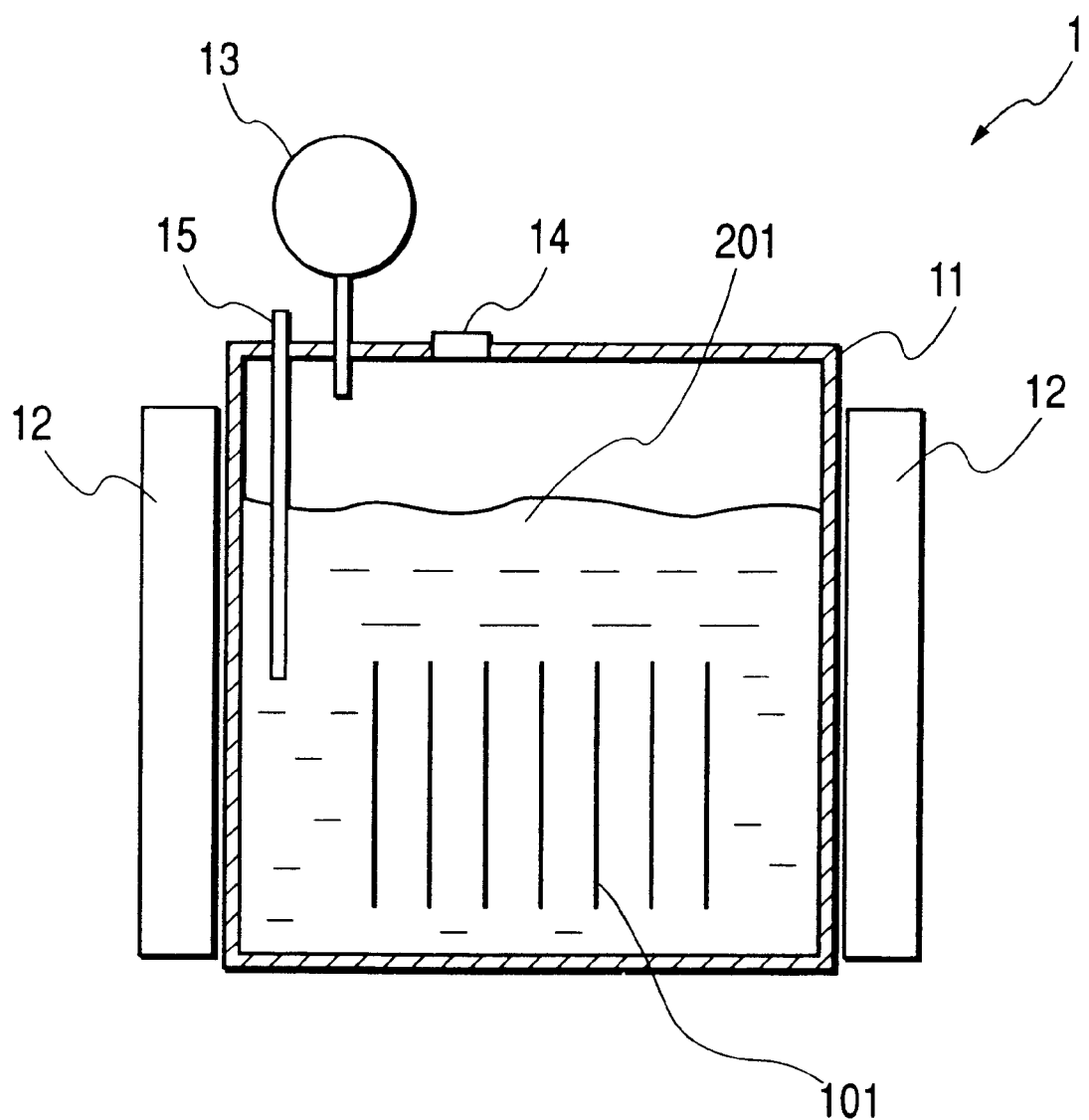
FIG. 1 is a view showing a basic configuration of a defect compensation apparatus used for the defect compensation method for a semiconductor element according to the present invention.

According to the compensation method for a defect of a semiconductor element of the present invention, a defect of a semiconductor or insulating film is effectively compensated by heat treatment (hereafter, hot water annealing) by contact of hot water with the semiconductor element. The present invention can be applied to improve the characteristics of not only a single layer film of a semiconductor or insulating film, but also a semiconductor junction such as MOS structure, MIS structure, Schottky junction, and pi, ni, nn, np, and pp.

For example, when the compensation method for a defect of a semiconductor element according to the present invention is applied to a photovoltaic element of the pin structure having a microcrystalline silicon semiconductor layer as the i layer, immediately after formation of the photovoltaic element, a small value of the fill factor considerably increases to improve the conversion efficiency of the photovoltaic element.

The photovoltaic element to which the present invention is applied, in a case where a light is incident on a substrate side, has a structure in which, for example, an electrode is optionally formed on an insulating substrate such as of glass or a conductive substrate such as of stainless steel, a reflection enhancing layer is formed thereon, a semiconductor layer of a first conductivity type, a substantially i-type semiconductor layer and a semiconductor layer of a second conductivity type different from the first conductivity type, are deposited thereon to form a semiconductor junction in the deposited semiconductor layers, an electrode layer such as of a transparent conductor, a metal, or the like is formed thereon, and a current collecting electrode is optionally deposited thereon.

The compensation method for a defect of a semiconductor element according to the present invention may be applied to a photovoltaic element of the configuration of the stack of a plurality of the above-described semiconductor layers.

The above-described semiconductors are preferably comprised of a microcrystalline silicon semiconductor, a microcrystalline germanium semiconductor, and a microcrystalline silicon germanium semiconductor. The microcrystalline semiconductor layer is preferably deposited by RF plasma CVD, VHF plasma CVD, or microwave plasma CVD.

The microcrystalline semiconductor is deposited under the following conditions.

Source gases for the supply of silicon atoms suitable for microcrystalline silicon preferably include a silane type source gas such as $SiH_4$, $Si_2H_6$, $SiF_4$, $SiHF_3$. $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3F$, $Si_2D_3H_3$, or the like as preferable. Particularly, in order to increase the crystal grain diameter, it is preferable to adopt $SiF_4$ as the source gas.

The source gases for germanium supply, suitable for microcrystalline silicon germanium, are exemplified by $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $GeH_6$, $GeD_6$, or the like. These source gases need to be diluted with hydrogen gas in order to form a microcrystalline semiconductor of good quality. The ratio of dilution with hydrogen gas is preferably 10 times or more. Particularly preferred dilution ratio ranges from 10 times to 100 times. In case of a small dilution ratio, no microcrystal is formed and an amorphous material is formed. On the other hand, in case of too high a dilution ratio, the deposition rate of a microcrystal is too low to practically pose a problem. Further, in combination with the hydrogen dilution, dilution with helium gas is available.

The substrate temperature for making a microcrystal suitable for the present invention ranges preferably from 100 to 500° C. Particularly, in order to enhance the deposition rate, it is preferable to use a relatively high substrate temperature.

The degree of vacuum inside a chamber during deposition of a microcrystal according to the present invention preferably ranges from 1 mTorr to 1 Torr. Particularly, in the case of depositing a microcrystalline semiconductor by the microwave plasma CVD method, the preferable degree of vacuum ranges from some mTorr to some hundreds Torr.

The power applied to the chamber in the case of depositing a microcrystal semiconductor according to the present invention preferably ranges from 0.01 to 10 W/cm³. The deposition rate of microcrystalline silicon depends on the electromagnetic wave used. Particularly, in the same applied energy, the power with a higher frequency shows a higher deposition rate.

The average crystal grain diameter of microcrystals suitable for the microcrystalline semiconductor of the photovoltaic element preferably ranges from 100 Å to 5000 Å on the basis of calculation based on a (220) peak of X-ray diffraction.

In such a microcrystalline semiconductor, there were many defects related to crystal grain boundaries and the characteristics of the photovoltaic element were low. Particularly, in the case where the deposition rate of the microcrystalline semiconductor layer was high, a strain occurred in the microcrystalline semiconductor during the course of growth of the microcrystalline semiconductor, thereby causing defects in the microcrystalline semiconductor.

When an impurity to control the conductivity type is added to such microcrystalline semiconductor layers to form a photovoltaic element of the pin structure, depending on the impurity added, the crystal grain diameters of the n-type layer and the p-type layer become different from that of the i-type layer, thereby causing many defects between the i-type layer and the n-type layer or p-type layer. In addition, when the transparent conductive layer or the metal layer is provided in contact with the n-type layer or p-type layer to take out the electric charge from the semiconductor layer to an external circuit, many defects based on an interface state or a strain exist around a contact interface between the n-type layer or p-type layer and the transparent conductive layer or the metal layer. By these defects, the resistance of the photovoltaic element increases to lower the conversion efficiency of the photovoltaic element.

Such defects of a photovoltaic element prepared up to the above-described step of forming the upper electrode can be compensated by the defect compensation method for a semiconductor element according to the present invention to thereby improve the characteristics of the photovoltaic element.

The photovoltaic element prepared up to the step of forming the upper electrode can be brought into contact with hot water to oxidize the defects, thus reducing them. The defects can be reduced by a larger binding energy between oxygen and silicon or germanium than the binding energy between silicon and silicon, the binding energy between germanium and germanium, and the binding energy between silicon and germanium.

During oxidization of the microcrystalline semiconductor by water, structural relaxation is enhanced between microcrystalline semiconductors to reduce the strain inside the microcrystalline semiconductors. As a result, the defects inside the microcrystalline semiconductor are reduced.

In the vicinity of the interface between the microcrystalline semiconductor layer and the electrode layer, water penetrates into the interface between the semiconductor layer and the electrode layer through the crystal grain boundaries of the electrode layer to accelerate oxidization and structural relaxation in the vicinity of the interface finally resulting in a reduction of defect states. Particularly, when such an oxide as indium oxide or tin oxide is used as the electrode layer, the method for the defect compensation using hot water is very effective.

If the defects are compensated by an oxidization method using water vapor or using a highly oxidative atmosphere such as an oxygen plasma, the electrode layer made of the above-described oxide is excessively oxidized to have a high resistance, increase the serial resistance of the photovoltaic element, and finally decrease the characteristics of the photovoltaic element. In the semiconductor element prepared by stacking such an oxide electrode layer and the semiconductor layer, when defects are compensated in water vapor or the highly oxidative atmosphere such as an oxygen plasma, decrease in the characteristics of the photovoltaic element is a problem commonly found.

The method for defect compensation using hot water according to the present invention can solve those problems.

When defects are compensated by using hot water, as compared to the use of water vapor, water molecules form an appropriate aggregation to react with the defect states at the crystal grain boundaries and the surface of the semiconductor element. In this case, it can be considered that the reactivity is suppressed as compared with respective single water molecules to keep an appropriate reactivity, resulting in defect compensation better than that of water vapor.

If the defect compensation of the semiconductor element is carried out in the absence of an electrode and an electrode is stacked after formation of a thick oxide layer on a surface of the semiconductor, a resistance component increases to deteriorate the characteristics of the semiconductor element. Therefore, it is preferable that the method for the defect compensation according to the present invention is applied after completion of the form of the semiconductor element to allow the electric taking out function. In the case where defects are compensated by contacting the semiconductor element such as the above-described photovoltaic element with hot water, the treatment may be conducted by dipping the semiconductor element in hot water. On the other hand, the treatment may be conducted by spraying hot water from a nozzle to the semiconductor element. In order to raise the temperature of hot water, it is preferable to do it by using a sealable pressurizing vessel. The preferable temperature of hot water ranges from 30 to 300° C, and the preferable pressure ranges from atmospheric pressure to 100 atm. These conditions are determined according to the shape of the semiconductor element, density of defects, and time for treatment. In the case of a thick layer of the semiconductor element, it is better to carry out the defect compensation by raising the water temperature and the pressure to compensate defects better and shorten the time for treatment.

In the case where defects are in the vicinity of the surface of the semiconductor element, it is better to treat under a relatively low temperature and low pressure to allow effective treatment of the defects. This is because, in the semiconductor element having a distribution of the defect density as above-described, treatment under a high temperature and high pressure may cause strain inside the semiconductor element to deteriorate the characteristics of the semiconductor.

In the case where the water temperature is lower than 30° C., the time for treating the semiconductor element becomes longer and the compensation of defects becomes insufficient. In the case where the water temperature is higher than 300° C., new phenomena, such as enhancing diffusion of impurities in the semiconductor element and incorporating impurities from the inner wall of the vessel for hot water treatment in the semiconductor element, may occur to deteriorate the characteristics of the semiconductor.

If the operation pressure is lower than atmospheric pressure, operability becomes worse and impractical. If the operation pressure is higher than 100 atm, the semiconductor element is increasingly damaged. According to the method for the defect compensation of the semiconductor element according to the present invention, defects of the semiconductor element are compensated by bubbling with an inert gas (at least one species of He, Ne, Ar, Kr, and Xe), one species of oxygen-containing gas, nitrogen-containing gas, and carbon-containing gas in hot water. Bubbling with these gases in hot water allows the semiconductor element to vibrate appropriately. As the result, it is considered that the compensation of defects is enhanced. Further, bubbling allows for removal of bubbles adsorbed to the surface of the semiconductor element to carry out the defect compensation evenly for the whole semiconductor element. Particularly, in the case where an oxygen-containing gas dissolves in hot water, it is considered that the defect compensation performance by hot water can be improved. For instance, if bubbling in hot water was done with an oxygen-containing gas, the state of the defect compensation was improved. Measurement of defects of the microcrystalline silicon semiconductor, which was treated with hot water bubbled with oxygen, by an ESR showed a decrease in defect density. Furthermore, X-ray diffraction measurement of the above-described microcrystalline silicon semiconductor showed that an angle of a peak of diffraction is the same as the angle of diffraction of a standard wafer, and the internal strain of the microcrystalline silicon semiconductor greatly decreased.

According to the method for the defect compensation of the semiconductor element according to the present invention by contacting the semiconductor element with hot water, the defect compensation performance can be further improved by making hot water weakly acidic. It is considered that hot water adjusted to be weakly acidic allows an improved contact state, namely wettability with water, of the semiconductor element with hot water, preferably to make aggregation of water made from hot water penetrate the defect part inside the semiconductor. According to the method for the defect compensation of the semiconductor element according to the present invention to compensate defect by contacting hot water, the range of acidity is preferably exemplified by a pH 4 or higher.

The method for the defect compensation in the semiconductor element according to the present invention by contacting the semiconductor element with hot water can be applied to semiconductor elements other than the photovoltaic element. Besides, the method according to the present invention can be applied to the defect compensation of an element comprising not only the microcrystalline semiconductor, but also the polycrystalline semiconductor. For instance, in the thin film transistor in which a source electrode and a drain electrode are installed on a glass substrate, the microcrystalline semiconductor layer or the polycrystalline semiconductor layer is stacked thereon, such an oxide film as of $SiO_2$ is formed thereon, and a gate electrode is formed thereon, application of the method for the defect compensation of the semiconductor element according to the present invention can compensate for defects in the semiconductor layer resulting in a very small quantity of water and OH⁻ groups remaining in the oxide layer. According to the method for the defect compensation of the semiconductor element according to the present invention aggregated water molecules penetrate from water into the semiconductor layer, and thus, water is unlikely to remain in the semiconductor layer. According to the method for the defect compensation of the semiconductor element according to the present invention, adsorbed water can be easily removed by drying after treatment of the defect compensation according to the present invention. Also concerning the OH⁻ groups, due to the presence of aggregations, of water molecules, OH⁻ groups keep a distance from defects in the oxide layer, and thus, OH⁻ groups can be removed from an oxide insulating layer by drying.

Examples of the apparatus according to the present invention will be described below with reference to the drawings.

FIG. 1 is a view showing the basic configuration of the defect compensation apparatus used for the compensation method for defect of the semiconductor element according to the present invention. The defect compensation apparatus 1 is used for reducing defects of the semiconductor element 101. The defect compensation apparatus 1 is configured by a pressurizable reaction vessel 11, a heating heater 12 to prepare hot water 201, a pressure gauge 13 for pressure measurement in the reaction vessel 11, a safety valve 14 to release an excessive pressure in the reaction vessel 11 to the outside, and a thermometer 15 comprising a thermocouple.

The defect compensation apparatus 1 is used for the defect compensation of the semiconductor element 101 through the following steps. First, the substrate, i.e., the semiconductor element 101 is located in the reaction vessel 11 in which hot water 201 is poured. Here, for use of convection of hot water 201, it is preferable to position the semiconductor element 101 vertically. In the reaction vessel 11 in which the semiconductor element 101 is positioned as described above, water is poured up to the height of or higher than the semiconductor element 101. Subsequently, the reaction vessel 11 is sealed to raise the water temperature up to any desired temperature by the heater 12. Then, the inert gas or oxygen-containing gas or the like is introduced from a cylinder (not illustrated) to the reaction vessel 11 when requested.

Subsequently, the pressure inside the reaction vessel 11 is adjusted to the desired pressure. Maintaining this status for the desired time, the defect compensation treatment is carried out. In addition, previously, an acid such as acetic acid, hydrochloric acid, nitric acid, sulfuric acid, or the like is added to the hot water to adjust the pH of the hot water 201.

Through these steps, heat treatment by contacting the semiconductor element 101 with hot water 201, in other words, hot water annealing, allows effective defect compensation in the semiconductor element 101.

Figure 2:
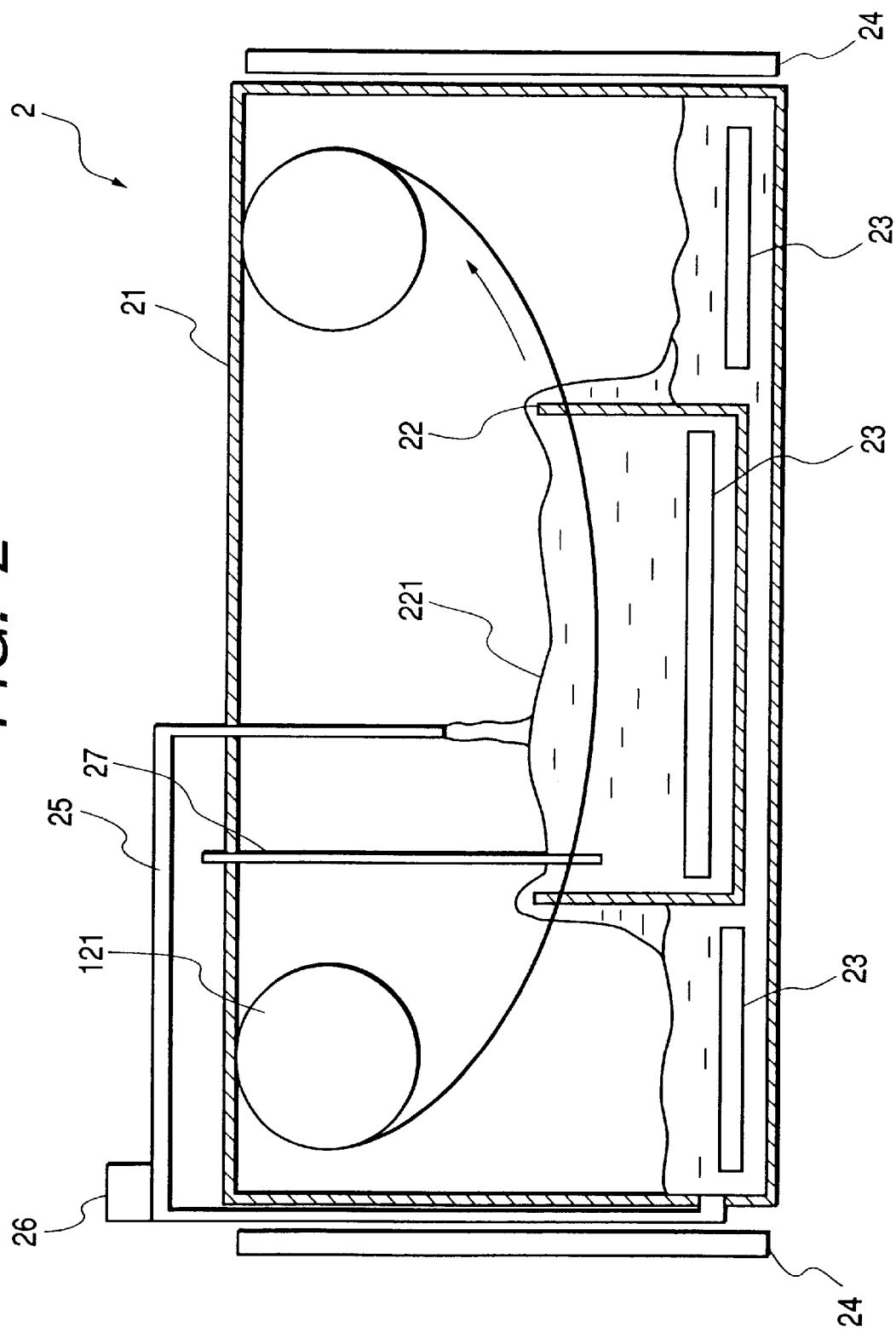
FIG. 2 is a view showing a basic configuration of a defect compensation apparatus for mass production used for the defect compensation method for a semiconductor element according to the present invention.

FIG. 2 is a view showing the basic configuration of the defect compensation apparatus used for the compensation method for defect of the semiconductor element according to the present invention for mass production. The defect compensation apparatus 2 of FIG. 2 is used for reducing defects of the belt-like substrate 121 on which the semiconductor element is formed. The defect compensation apparatus 2 is configured by a reaction vessel 21, an internal reaction vessel 22 installed in the reaction vessel 21, the heating heater 23 to prepare hot water 221, a thermal insulating material 24 of the reaction vessel 21, a pipe 25 to flow hot water 221, a pump unit 26 to circulate hot water 221 across the internal reaction vessel 22 and the reaction vessel 21, and a thermometer 27 to monitor the temperature of hot water 221. According to this configuration, the pipe 25 and the pump unit 26 overflow hot water 221 from the internal reaction vessel 22 to the reaction vessel 21.

The belt-like substrate 121 is set in the reaction vessel 21, and water is poured in the internal reaction vessel 22 and the reaction vessel 21. Working the pump unit 26, the water temperature is raised to the desired temperature by using the heater 23 to prepare hot water 221. After the temperature of hot water 221 becomes the desired temperature, transporting the belt-like substrate 121, the defect compensation of the present invention is carried out. Then, in consideration of the temperature of hot water 221, a transporting rate of the belt-like substrate 121 is appropriately determined.

Thus, according to heat treatment by contacting the belt-like substrate 121 with hot water 221, the defect compensation of the semiconductor can be performed effectively.

FIG. 2 is the defect compensation apparatus 2 using one reaction vessel 21. It is also a preferable mode that the defect compensation is successively conducted with a combination of a plurality of such compensation apparatuses 2 under different defect treatment conditions.

EXAMPLES

The present invention will be described in detail below with reference to examples. The present invention should not be restricted to the following examples.

Example 1

In Example 1, the photovoltaic element is formed and the method for the defect compensation of the semiconductor element according to the present invention was applied. In Example 1, the defect compensation apparatus 1 is used for the defect compensation of the semiconductor element. In order to form the photovoltaic element, a silver layer of 1000 Å (100 nm) was deposited on a stainless steel substrate by electron beam vapor deposition to deposit a reflection enhancing layer made of a zinc oxide thereon.

The reflection-enhancing layer made of a zinc oxide was deposited by sputtering using a zinc oxide target. Besides, the zinc oxide layer of 1 μm was under a substrate temperature of 250° C. and in a deposition rate of 20 Å (2 nm)/S. Observation of the surface of the zinc oxide layer using an atomic force microscope showed an average unevenness period of about 2000 Å (200 nm). An average depth of the unevenness was 1000 Å (100 nm). On such a substrate, under the deposition conditions shown in Table 1, the semiconductor layer of the photovoltaic element made of microcrystalline silicon was formed.

The n-type semiconductor layer was deposited by the RF plasma CVD method. The i-type semiconductor layer was deposited by the microwave plasma CVD method. The p-type semiconductor layer was deposited by the RF plasma CVD method. The X-ray diffraction measurement of these stacked semiconductor layers showed the highest peak at (220). The average crystal grain diameter calculated from a half-width of the peak of this (220) peak on the basis of Scheller's equation was 500 Å (50 nm). Measurement of the surface of the p-type layer by electron beam diffraction showed a spot, and thus, a crystallized p-type layer was confirmed.

For the photovoltaic element deposited up to such a p-type layer, indium oxide of 700 Å (70 nm) thickness was deposited on the p-type layer by sputtering. In an oxidized indium target, tin oxide was contained up to 5%. By using the target, deposition was operated under the substrate temperature of 195° C. and in the deposition rate of 5 Å/s. On a clear conductive layer made of indium oxide, a metal electrode was formed as the current collecting electrode.

To the photovoltaic element made of the microcrystalline silicon semiconductor layer with this layered structure, the method of the present invention for the defect compensation was applied by contacting hot water with the photovoltaic element. The temperature of the hot water, the pressure inside the treating vessel, treating time (time for contacting with hot water,) and a treating result are shown in Table 2. Table 2 shows a value of photoelectric conversion efficiency of the photovoltaic element after hot water treatment, assuming that the photoelectric conversion efficiency of the photovoltaic element before contact with hot water is 1.00.

When the temperature of the hot water was 300° C., helium gas was filled in the treating vessel to make the pressure inside the reaction vessel 100 atm. Characteristics of the photovoltaic element after hot water treatment according to the present invention were evaluated on the basis of conversion efficiency of the photovoltaic element. As the result, as shown in Table 2, practically satisfactory improvement of characteristics was observed under the temperature of hot water ranging from 30 to 300° C. and the pressure ranging 1 to 100 atm. In sample Nos. 1-1, 1-2 and 1-3 in which water temperature were low, slight improvement of characteristics was observed. In sample No. 1-1 treated under the temperature of 350° C., oxidation proceeded excessively to deteriorate photovoltaic characteristics.

Example 2

In Example 2, the photovoltaic element was deposited under the same conditions as Example 1, in addition to the condition of the sample No. 1-7 of the Example 1, under the condition in which oxygen was sent to the hot water in the rate of 20 sccm to conduct the defect compensation treatment. The defect compensation was carried out using the defect compensation apparatus 1 of FIG. 1.

As the result, in comparison with characteristics of the photovoltaic element subjected to treatment of the sample No. 1-7 of Example 1, conversion efficiency was improved 1.05 times. For the sample, by using secondary ion mass spectroscopy, distribution was measured for oxygen atoms in a film thickness direction and in-plane. As the result, it was found that many oxygen molecules were distributed in the crystal grain boundary. Besides, differences of the position of diffraction of a single crystal from a position of diffraction by X-ray diffraction (220) was tested by comparison. As the result, the position of diffraction line of the microcrystal of Example 2 was identical with the position of diffraction of a single crystal. Therefore, it was ensured that by the defect compensation treatment of the present invention, strain in the microcrystalline semiconductor was relaxed.

Example 3

In Example 3, the photovoltaic element, of which the i-type layer was made by using microcrystalline silicon germanium, was formed under the condition shown in Table 3 through the same steps as those of Example 1.

For the photovoltaic element, the crystal grain diameter calculated by the X-ray diffraction instrument yielded about 600 Å (60 nm.) For the photovoltaic element formed by such a method, the defect compensation of the photovoltaic element was carried out under the temperature of hot water and the pressure shown in Table 4. The definition of data presented in Table 4 is the same as that of Table 2.

Under conditions in which the pressure is higher than vapor pressure, argon gas is used to adjust the pressure. The result is shown in Table 4 with compilation.

In the photovoltaic element treated under the temperature ranging from 30 to 300° C. and the pressure ranging from 1 to 100 atm of hot water, satisfactory improvement of characteristics was observed.

Example 4

In Example 4, the photovoltaic element comprising the microcrystalline silicon semiconductor was prepared under the conditions of Table 1 of Example 1, and hot water is contacted with the semiconductor element of the present invention to compensate defects. In Example 4, the defect compensation was carried out using the defect compensation apparatus 1 shown in FIG. 1. In such a case, an experiment was conducted through adjusting the pH of hot water by acetic acid and sodium hydroxide, as shown in Table 5. Time for treatment was 4 hours. The definition of data presented in Table 5 is the same as that of Table 2.

As the result, a good improvement of characteristics of the photovoltaic element was yielded at pH 4 to 7. In a region where the pH is lower than 4, peeling of the film was observed in the semiconductor element to inhibit characteristics of the photovoltaic element. In the situation under a pH higher than 7, an alkali metal remains in the semiconductor to deteriorate photovoltaic characteristics. Therefore, the pH ranging from 4 to 7 allowed for good defect compensation.

Example 5

In Example 5, the source electrode and the drain electrode were formed on a quartz substrate by aluminium vacuum vapor deposition, and on the layer thereof, a 1 μm amorphous silicon layer was deposited by normal RF plasma CVD method. Subsequently, a region between the source electrode and the drain electrode was crystallized by an excimer laser (XeCl) 300 mJ/cm² under an atmospheric temperature of 500° C. to make the semiconductor layer polycrystallize. On this semiconductor, an oxidized silicon layer of 1000 Å (100 nm) was deposited by the RF plasma CVD method. On this oxidized silicon layer, an aluminium gate electrode was formed.

For the thin film transistor prepared by the above-described method transistor characteristics were measured. Then, using the defect compensation apparatus 1 shown in FIG. 1, the compensation method for defect of the semiconductor element according to the present invention was performed. The defect compensation was carried out under the hot water temperature of 100° C. and the pressure of 1 atm for 3 hours. Following this step, transistor characteristics were measured again. As the result, a flat band voltage of the thin film transistor was distinctly improved from −4.6 V to −0.5 V.

According to the above-described compensation method for a defect of the semiconductor element according to the present invention, compensating a defect by contacting the semiconductor element with hot water allows for compensating a defect of a crystal grain boundary or an interface between stacked layers. Further, according to the compensation method for a defect of the semiconductor element according to the present invention, a strain inside the crystal can be removed. Furthermore, water and OH⁻ groups remaining in a crystal grain boundary and around an interface state can be reduced as much as possible. Also, the characteristics of the semiconductor element are improved and the stability of the semiconductor element is improved.

TABLE 1

| Layer | Gas | | | | |
|---|---|---|---|---|---|
| | $SiH_4$ | $SiF_4$ | $H_2$ | $PH_3(2\%/H_2)$ | $BF_3(2\%/H_2)$ |
| n | 2 | — | 48 | 0.5 | — |
| i | — | 80 | 240 | — | — |
| p | 0.025 | — | 35 | — | 1 |

| | Power Density (W/cm³) | | Degree of Vacuum | Deposition Rate | Substrate Temperature | Layer Thickness (Å) |
|---|---|---|---|---|---|---|
| | RF | MW | (mTorr) | (Å/s) | (C°) | |
| n | 0.0382 | — | 1300 | 1 | 225 | 200 |
| i | — | 0.15 | 100 | 15 | 400 | 20000 |
| p | 1.15 | — | 2000 | 1 | 165 | 50 |

TABLE 2

| Sample No. | Temp. of Hot Water (C. °) | Pressure (atm.) | Treating Time (hour) | Treating Result |
|---|---|---|---|---|
| 1-1 | 0 | 1 | 4 | 1.00 |
| 1-2 | 10 | 1 | 4 | 1.00 |
| 1-3 | 20 | 1 | 4 | 1.00 |
| 1-4 | 30 | 1 | 4 | 1.05 |
| 1-5 | 40 | 1 | 4 | 1.07 |
| 1-6 | 50 | 1 | 4 | 1.08 |
| 1-7 | 80 | 1 | 4 | 1.15 |
| 1-8 | 100 | 1 | 4 | 1.15 |
| 1-9 | 120 | 1.96 | 4 | 1.15 |
| 1-10 | 200 | 15.35 | 0.5 | 1.10 |
| 1-11 | 250 | 39.26 | 0.3 | 1.10 |
| 1-12 | 280 | 63.35 | 0.2 | 1.10 |
| 1-13 | 300 | 84.73 | 0.1 | 1.08 |
| 1-14 | 300 | 100 | 0.1 | 1.06 |
| 1-15 | 350 | 163.21 | 0.1 | 0.95 |

TABLE 3

| Layer | Gas | | | | | |
|---|---|---|---|---|---|---|
| | $SiH_4$ | $SiF_4$ | $GeH_4$ | $H_2$ | $PH_3(2\%/H_2)$ | $BF_3(2\%/H_2)$ |
| n | 2 | — | — | 48 | 0.5 | — |
| i | — | 80 | 10 | 240 | — | — |
| p | 0.025 | — | — | 35 | — | 1 |

| | Power Density (W/cm³) | | Degree of Vacuum | Deposition Rate | Substrate Temperature | Layer Thickness (Å) |
|---|---|---|---|---|---|---|
| | RF | MW | (mTorr) | (Å/s) | (C°) | |
| n | 0.0382 | — | 1300 | 1 | 225 | 200 |
| i | — | 0.15 | 100 | 20 | 400 | 15000 |
| p | 1.15 | — | 2000 | 1 | 165 | 50 |

TABLE 4

| Sample No. | Temp. of Hot Water (C.°) | Pressure (atm) | Treating Time (hour) | Treating Result |
|---|---|---|---|---|
| 3-1 | 0 | 1 | 4 | 1.00 |
| 3-2 | 10 | 1 | 4 | 1.00 |
| 3-3 | 20 | 1 | 4 | 1.00 |
| 3-4 | 30 | 1 | 4 | 1.05 |
| 3-5 | 40 | 10 | 1 | 1.07 |
| 3-6 | 50 | 20 | 1 | 1.08 |
| 3-7 | 90 | 30 | 1 | 1.10 |
| 3-8 | 100 | 10 | 1 | 1.10 |
| 3-9 | 120 | 10 | 1 | 1.10 |
| 3-10 | 200 | 30 | 0.3 | 1.08 |
| 3-11 | 250 | 50 | 0.2 | 1.07 |
| 3-12 | 280 | 100 | 0.1 | 1.06 |
| 3-13 | 300 | 84.73 | 0.1 | 1.05 |
| 3-14 | 300 | 100 | 0.1 | 1.05 |
| 3-15 | 350 | 163.21 | 0.1 | 0.95 |

TABLE 5

| Sample No. | Temp. of Hot Water (C. °) | Pressure (atm.) | pH | Treating Result |
|---|---|---|---|---|
| 4-1 | 100 | 1 | 3 | Film peeled off |
| 4-2 | 100 | 1 | 3.5 | Film peeled off |
| 4-3 | 100 | 1 | 4 | 1.10 |
| 4-4 | 100 | 1 | 4.5 | 1.10 |

TABLE 5-continued

| Sample No. | Temp. of Hot Water (C. °) | Pressure (atm.) | pH | Treating Result |
|---|---|---|---|---|
| 4-5 | 100 | 1 | 5 | 1.10 |
| 4-6 | 100 | 1 | 5.5 | 1.15 |
| 4-7 | 100 | 1 | 6 | 1.20 |
| 4-8 | 100 | 1 | 6.5 | 1.20 |
| 4-9 | 100 | 1 | 7 | 1.15 |
| 4-10 | 100 | 1 | 8 | 0.95 |

What is claimed is:

1. A defect compensation method for a semiconductor element to compensate defect of the semiconductor element, wherein hot water is contacted with semiconductor element to make the defect compensation of the semiconductor element.

2. The defect compensation method for the semiconductor element according to claim 1, wherein the defect compensation is carried out by controlling a temperature of the semiconductor element.

3. The defect compensation method for the semiconductor element according to claim 1, wherein the defect compensation is carried out bubbling with at least one species of He, Ne, Ar, Kr, and Xe as an inert gas, one species of oxygen-containing gas, nitrogen-containing gas, and carbon-containing gas in the hot water.

4. The defect compensation method for the semiconductor element according to claim 1, wherein an atmospheric pressure, when the defect compensation is carried out by contacting hot water with the semiconductor element, ranges from 1 atm. to 100 atm.

5. The defect compensation method for the semiconductor element according to claim 1, wherein the temperature of the hot water ranges from 30 to 300° C.

6. The defect compensation method for the semiconductor element according to claim 1, wherein oxygen-containing gas is contained in the hot water.

7. The defect compensation method for the semiconductor element according to claim 6, wherein the oxygen-containing gas is $O_2$.

8. The defect compensation method for the semiconductor element according to claim 1, wherein the hot water is acidic.

9. The defect compensation method for the semiconductor element according to claim 1, wherein the semiconductor element comprises silicon atoms.

10. The defect compensation method for the semiconductor element according to claim 1, wherein the semiconductor element comprises germanium atoms.

11. The defect compensation method for the semiconductor element according to claim 1, wherein the semiconductor element is a transistor.

12. The defect compensation method for the semiconductor element according to claim 2, wherein the defect compensation is carried out bubbling with at least one species of He, Ne, Ar, Kr, and Xe as an inert gas, one species of oxygen-containing gas, nitrogen-containing gas, and carbon-containing gas in the hot water.

13. The defect compensation method for the semiconductor element according to claim 3, wherein an atmospheric pressure, when the defect compensation is carried out by contacting hot water with the semiconductor element, ranges from 1 atm. to 100 atm.

14. The defect compensation method for the semiconductor element according to claim 3, wherein the temperature of the hot water ranges from 30 to 300° C.

15. The defect compensation method for the semiconductor element according to claim 4, wherein the temperature of the hot water ranges from 30 to 300° C.

16. The defect compensation method for the semiconductor element according to claim 3, wherein oxygen-containing gas is contained in the hot water.

17. The defect compensation method for the semiconductor element according to claim 4, wherein oxygen-containing gas is contained in the hot water.

18. The defect compensation method for the semiconductor element according to claim 5, wherein oxygen-containing gas is contained in the hot water.

19. The defect compensation method for the semiconductor element according to claim 3, wherein the hot water is acidic.

20. The defect compensation method for the semiconductor element according to claim 4, wherein the hot water is acidic.

21. The defect compensation method for the semiconductor element according to claim 5, wherein the hot water is acidic.

22. The defect compensation method for the semiconductor element according to claim 6, wherein the hot water is acidic.

* * * * *